United States Patent [19]

Matsuo et al.

[11] Patent Number: 4,716,308

[45] Date of Patent: Dec. 29, 1987

[54] MOS PULL-UP OR PULL-DOWN LOGIC CIRCUIT HAVING EQUALIZED DISCHARGE TIME DELAYS AND LAYOUT AVOIDING CROSSOVERS

[75] Inventors: Kenji Matsuo, Yokohama; Itsuo Sasaki, Kawasaki; Hiroaki Suzuki, Yokohama; Mitsuyuki Kunieda, Kawasaki, all of Japan

[73] Assignee: Tokyo Shibaura Denki Kabushiki Kaisha, Kawasaki, Japan

[21] Appl. No.: 518,751

[22] Filed: Jul. 29, 1983

[30] Foreign Application Priority Data

Jul. 30, 1982 [JP] Japan .................. 57-133541
Jul. 30, 1982 [JP] Japan .................. 57-133576

[51] Int. Cl.⁴ .................. H03K 19/017; H01L 27/04; H01L 29/78
[52] U.S. Cl. .................. 307/303; 307/443; 307/448; 307/357; 307/579; 357/23.14; 357/45; 357/71
[58] Field of Search .................. 307/443, 448, 450–453, 307/354, 357, 364, 576, 579, 585, 303; 357/23.14, 45, 71

[56] References Cited

U.S. PATENT DOCUMENTS

| | | | |
|---|---|---|---|
| 3,900,742 | 8/1975 | Hampel et al. | 307/451 X |
| 3,945,000 | 3/1976 | Suzuki et al. | 307/451 X |
| 4,074,151 | 2/1978 | Buckley et al. | 307/304 X |
| 4,367,420 | 1/1983 | Foss et al. | 307/453 |
| 4,394,586 | 7/1983 | Morozumi | 307/452 X |
| 4,401,903 | 8/1983 | Iizuka | 307/451 X |
| 4,489,246 | 12/1984 | Nishiuchi | 307/448 |
| 4,507,574 | 3/1985 | Seki et al. | 307/451 X |

FOREIGN PATENT DOCUMENTS 0055570 7/1982 European Pat. Off.
0083482 7/1983 European Pat. Off.
2074372 10/1981 United Kingdom.

OTHER PUBLICATIONS

Mead & Conway, *Introduction to VLSI Design*, Addison-Wesley Pub. Co., Reading, Mass, Oct. 1980, plate, p. 152.
U.S. patent application Ser. No. 116,556 filed on Jan. 29, 1980.

*Primary Examiner*—Stanley D. Miller
*Assistant Examiner*—D. R. Hudspeth
*Attorney, Agent, or Firm*—Finnegan, Henderson, Farabow, Garrett & Dunner

[57] ABSTRACT

A MOS logic circuit comprises two P channel MOSFETs connected in parallel between a positive power source $V_{DD}$ and a logic signal output terminal and two series circuits connected in parallel between a ground voltage source $V_{SS}$ and the terminal, each series circuit being comprised of serially connected two N channel MOSFETs. The gate electrodes of the MOSFETs located in the corresponding positions in the respective series circuits are connected to first and second logic signal input terminals, respectively. Similarly, the gate electrodes of the other MOSFETs located in the corresponding positions in the respective series circuits are connected to the second and first logic signal input terminals, respectively.

3 Claims, 30 Drawing Figures

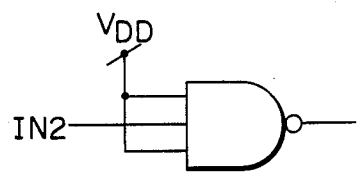
F I G. 7A
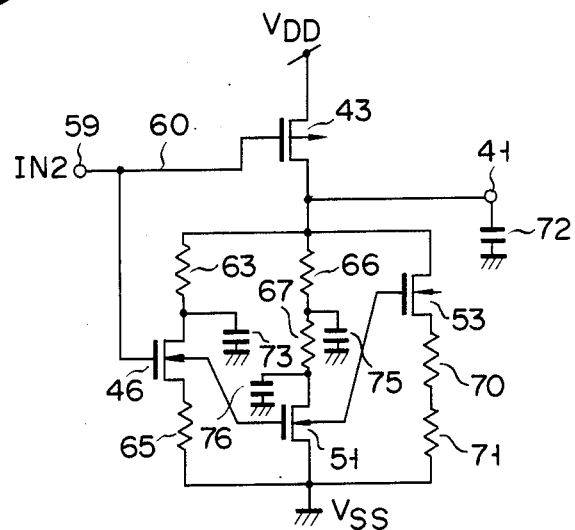
F I G. 7B
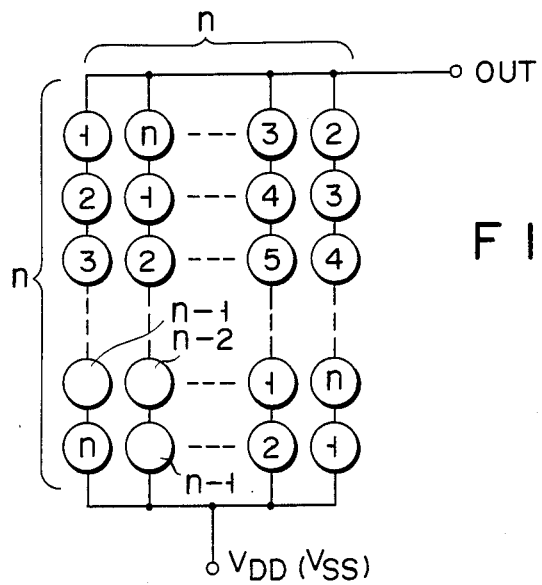
F I G. 8

F I G. 9A
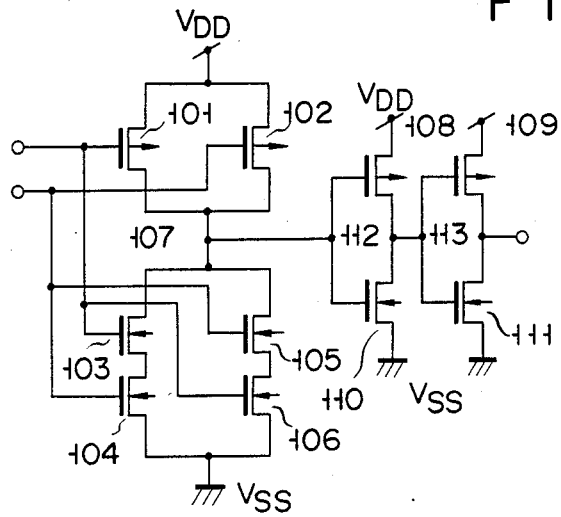
F I G. 9B
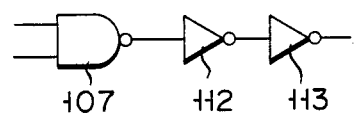
F I G. 10A
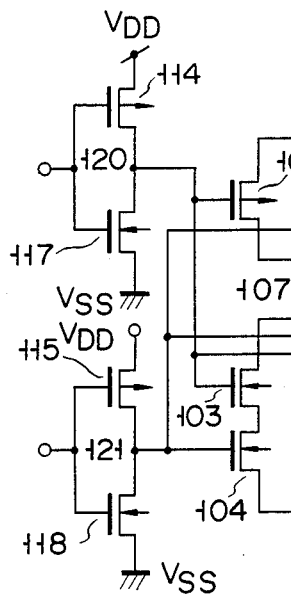
F I G. 10B
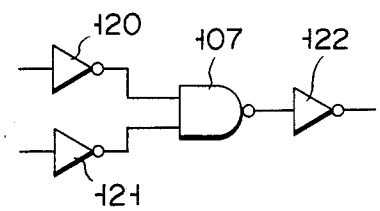

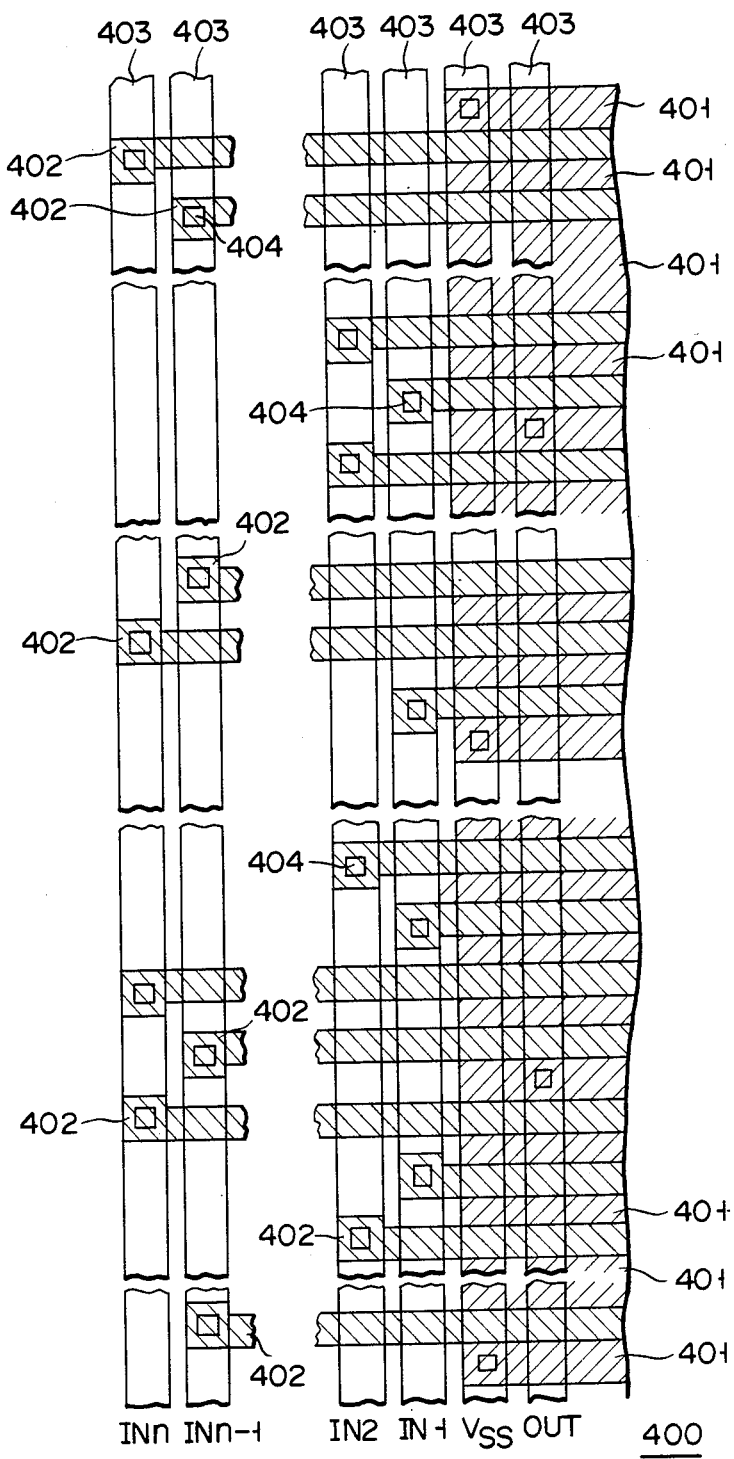

MOS PULL-UP OR PULL-DOWN LOGIC CIRCUIT HAVING EQUALIZED DISCHARGE TIME DELAYS AND LAYOUT AVOIDING CROSSOVERS

BACKGROUND OF THE INVENTION

This invention relates to a MOS logic circuit constructed by connecting in series more than two MOSFETs, each supplied with a different logic signal between a power source and signal output terminal. More particularly, the invention relates, to a MOS logic circuit which, when one of a plurality of signal input terminals is used as an inversion circuit, assures a reduction in the variations of a circuit property depending on the position of said signal input terminal.

FIG. 1A shows the circuit arrangement of the conventional 2-input CMOS NAND gate. In this circuit arrangement, two current passages consisting of P channel MOSFETs 2, 3 are connected in parallel between a positive power source $V_{DD}$ and logic signal output terminal 1; and two current passages consisting of N channel MOSFETs 4, 5 are connected in series between said logic signal output terminal 1 and ground voltage source $V_{SS}$. The gate electrode of said MOSFET 2 and that of said MOSFET 4 are jointly connected to a logic signal input terminal 6 which is supplied with a logic input signal IN1. The gate electrode of said MOSFET 3 and that of said MOSFET 5 are jointly connected to a logic signal input terminal 7 which is supplied with a logic input signal IN2.

With the above-mentioned 2-input type NAND gate, a logic output signal OUT whose level is determined by a combination of the logic levels of said logic input signals IN1, IN2 is sent forth from the logic signal output terminal 1. The 2-input type NAND gate is indicated by a symbol in FIG. 1B. The conventional 2-input NAND gate of FIG. 1A is sometimes applied as an inverter in which two independent input signals IN1, IN2 are supplied to the corresponding input terminals 6, 7; a voltage having the level $V_{DD}$ (high level) is always impressed as one of the input signals; and a signal having a high or low level is supplied, thereby inverting one input signal. However, the conventional 2-input NAND gate of FIG. 1A has the drawback that when said NAND gate is used as an inverter by operating one of the input terminals, circuit properties such as a switching speed and circuit threshold voltage are governed by the position of the input terminal and undergo changes. The application of one of the input terminals as an inverter results in changes in the switching speed or circuit threshold voltage, depending on the position of said input terminal. This event occurs not only in the 2-input NAND gate but also in a NAND gate or NOR gate having more than two input terminals.

SUMMARY OF THE INVENTION

It is accordingly the object of this invention to provide a MOS logic circuit in which, when one of the input terminals is applied as an inverter, it is possible to eliminate the dependency of the switching speed and circuit threshold voltage on the position of said input terminal.

To attain the above-mentioned object, this invention provides a MOS logic circuit which comprises:

A semiconductor substrate of a first conductivity type;

first to fifth semiconductor regions of a second conductivity type, arranged on the substrate and aligned parallel to one another with a specific interval therebetween;

first to fourth gate layers, respectively formed between the first and second semiconductor regions, the second and third semiconductor regions, the third and fourth semiconductor regions and the fourth and fifth semiconductor regions;

a conductive layer, connected to the first and fifth semiconductor regions, for supplying a power supply voltage to the first and fifth semiconductor regions;

a second conductive layer, connected to the third semiconductor region, for outputting a logic output signal from the third semiconductor region;

a third conductive layer, connected to the second and fourth gate layers, for supplying a first logic input signal to the second and fourth gate layers; and a fourth conductive layer, connected to the first and third gate layers, for supplying a second logic input signal to the first and second gate layers.

In addition, a second embodiment of the subject invention is arranged similar to that of the above-mentioned embodiment but comprises first to tenth semiconductor regions, first to ninth gate layers, and first to fifth conductive layers.

Preferably, the first to fourth conductive layers of the first embodiment are aligned parallel to one another and perpendicular to the first to fourth gate layers. With regard to the second embodiment, it is preferably that the first to fifth conductive gate layers be aligned parallel to one another and aligned perpendicular to the first through ninth gate layers.

BRIEF DESCRIPTION OF THE DRAWINGS

FIG. 7A is a symbol indicating a circuit arrangement when the MOS logic circuit symbolized in FIG. 4B is applied as an inverter;

FIG. 7B is an equivalent circuit to that found in FIG. 7A;

FIG. 8 is a broadened circuit arrangement of the subject MOS logic circuit involving all conceivable applications;

FIGS. 9A to 13A indicate the arrangements of MOS logic circuits according to various embodiments of the invention;

FIGS. 9B to 13B symbolize the arrangements of MOS logic circuits corresponding to the embodiments thereof shown in FIGS. 9A to 13A;

FIG. 19 is a pattern plan view corresponding to the integration of the circuit of FIG. 8.

DETAILED DESCRIPTION OF THE PREFERRED EMBODIMENTS

Figure 1A:
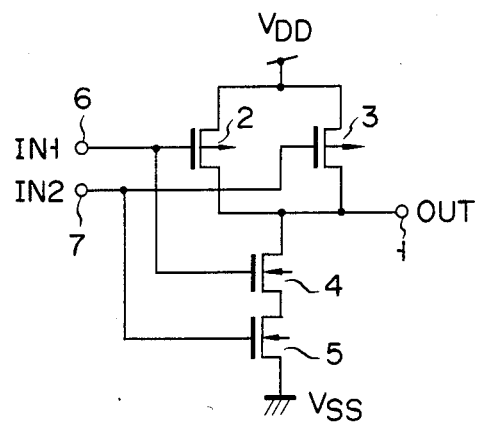
FIG. 1A shows the circuit arrangement of a conventional MOS logic circuit acting as a 2-input NAND gate.
Figure 1B:
FIG. 1B illustrates a symbol of the MOS logic circuit of FIG. 1A.

Description will now be given of a MOS logic circuit according to a first embodiment of this invention. This MOS logic circuit involves the same 2-input CMOS NAND gate as the conventional type of FIG. 1A. With said MOS logic circuit, two P channel MOSFETs 12, 13, each acting as a current path on passage, are connected in parallel between the positive power source $V_{DD}$ and logic signal output terminal 11. Connected in parallel between said logic signal output terminal 11 and ground voltage source $V_{SS}$ are a series circuit 16 consisting of two series connected N channel MOSFETs 14, 15, each acting as a current passage, and a series circuit 19 consisting of two series connected N channel MOSFETs 17, 18, each acting as a current passage. The gate electrodes of the MOSFETs 12, 14, 18 are jointly connected through a line 21 to a logic signal input terminal 20 supplied with a logic signal IN1. Likewise, the gate electrodes of the MOSFETs 13, 15, 17 are jointly connected through a line 23 to a logic signal input terminal 22 supplied with a logic signal IN2.

Figure 2:
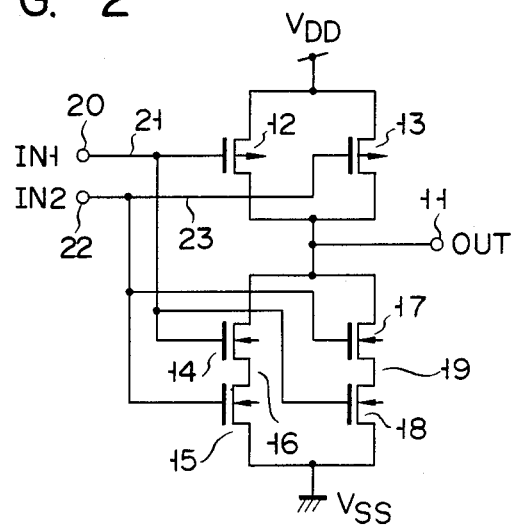
FIG. 2 indicates the arrangement of a MOS logic circuit according to a first embodiment of this invention.

The MOS logic circuit according to the first embodiment of FIG. 2, is characterized by the fact that on the N channel side, the gate electrodes of two MOSFETs 14, 15, constituting one (circuit 16) of the two series circuits, are selectively connected to either of two input terminals 20, 22. Likewise, the gate electrodes of two MOSFETs 17, 18 constituting the other (circuit 19) of said two series circuits are selectively connected to either of said two input terminals 20, 22. Likewise the gate electrode of the MOSFET 14 included in the series circuit 16 and the gate electrode of the MOSFET 17 which is included in the series circuit 19 and occupies the same corresponding position as MOSFET 14 are each connected to a different one of said two input terminals 20, 22. The gate electrode of the MOSFET 15 included in the series circuit 16 and the gate electrode of the MOSFET 18 which is included in the series circuit 19 and occupies the same corresponding position as MOSFET 15 are each connected to a different one of said two input terminals 20, 22.

When the subject MOS logic circuit involves the ordinary 2-input NAND gate, the two input terminals are respectively supplied with input signals IN1, IN2. One or both of the MOSFETs 14, 15 included in the series circuit 16 are rendered conducting or nonconducting in the same manner that one or both of the MOSFETs 17, 18 included in the series circuit 19 are rendered conducting or nonconducting. Consequently, the output terminal 11 sends forth an output signal obtained by converting two input signals IN1, IN2 into the form of the NAND logic. In other words, the MOS logic circuit of FIG. 2 acts as the ordinary 2-input NAND gate.

Figure 3A:
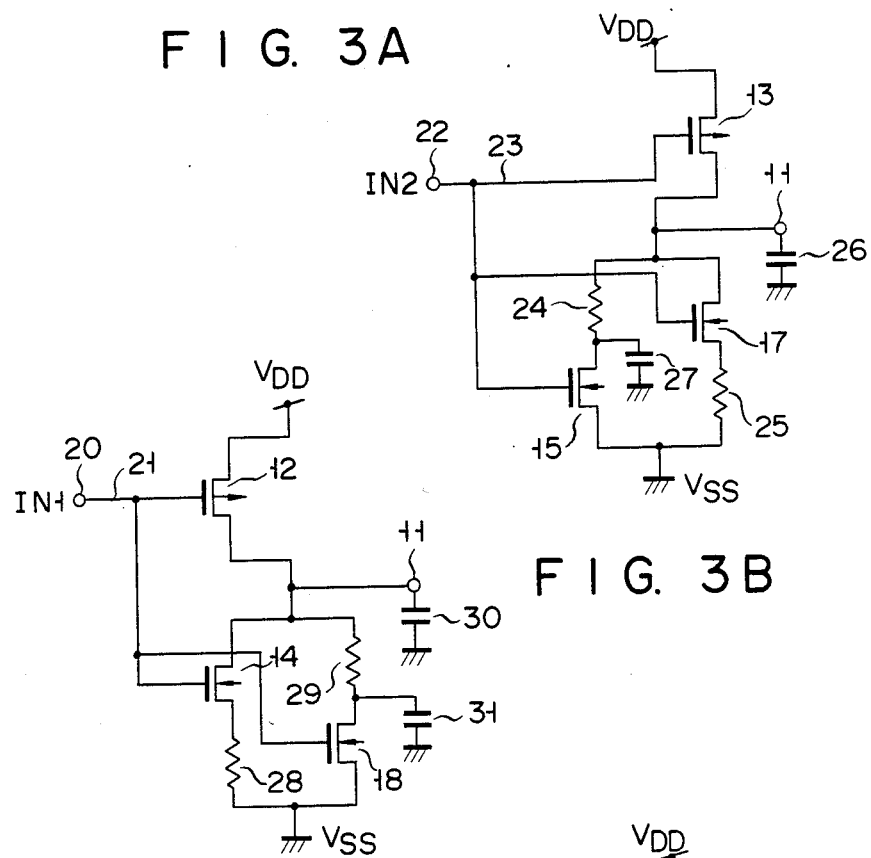
FIGS. 3A and 3B are equivalent circuit arrangements when the MOS logic circuit of FIG. 2 is applied as an inverter.

The case where the above-mentioned NAND gate is applied as an inverter by fixing one or the other of the two input signals IN1, IN2 at a high level will now be described. When the input signal IN1 is set at a high level, the P channel MOSFET 12 is always rendered nonconducting, and two N channel MOSFETs 14, 18 are always rendered conducting. FIG. 3A shows an equivalent circuit corresponding to the above-mentioned condition. In this equivalent circuit, only a P channel MOSFET 13 whose gate electrode is connected to an input terminal 22 is provided between the power source $V_{DD}$ and output terminal 11. Connected in series between the output terminal 11 and ground voltage source $V_{SS}$ are a resistor 24 having a resistance equal to that of the N channel MOSFET 14 when rendered conducting and the N channel MOSFET 15. Connected in parallel with said series circuit is a series circuit consisting of the N channel MOSFET 17 and a resistor 25 having a resistance equal to that of the N channel MOSFET 18 when rendered conducting. The gate electrodes of the MOSFETs 15, 17 are connected to the input terminal 22.

In the MOS logic circuit of FIG. 2, a parasitic capacitance exists between the respective circuit junctions and the power source $V_{DD}$ or the other ground voltage source $V_{SS}$. A load capacitance is present between the output terminal 11 and power source $V_{DD}$ and also between said output terminal 11 and ground voltage source $V_{SS}$. The equivalent circuit of FIG. 3A indicates the only capacitance substantially related to the charge and discharge of the output terminal 11 of said equivalent circuit. Namely, a load capacitor 26 is present between the output terminal 11 and ground voltage source $V_{SS}$. A parasitic capacitor 27 corresponding to the channel width of the MOSFET 14 exists between the ground voltage source $V_{SS}$ and the junction of the series connected resistor 24 and MOSFET 15.

Figure 3B:
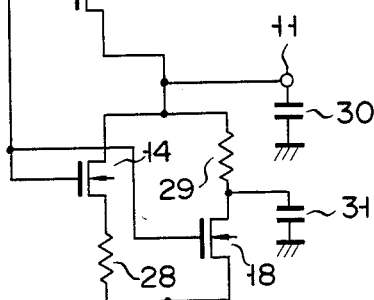

When the input signal I2 is always set at a high level as opposed to the foregoing description of the MOS logic circuit in FIG. 2, then the P channel MOSFET 13 is always rendered nonconducting and the two N channel MOSFETs 15, 17 are always rendered conducting. FIG. 3B indicates an equivalent circuit corresponding to the above-mentioned condition. Connected between the power source $V_{DD}$ and output terminal 11 is only the P channel MOSFET 12 whose gate electrode is connected to the input terminal 20. Referring to the equivalent circuit of FIG. 3B, an N channel MOSFET 14 and a resistor 28 having an equal resistance to that of the N channel MOSFET 15 when rendered conducting are connected in series between the output terminal 11 and ground voltage source $V_{SS}$. Connected in parallel with the above-mentioned series circuit is a series circuit consisting of a resistor 29 having a resistance equal to that of the N channel MOSFET 17 when rendered conducting and an N channel MOSFET 18. Referring to the equivalent circuit of FIG. 3B, the capacitance substantially related to the charge and discharge of the same output terminal 11 as that of FIG. 3A are described below. A load capacitor 30 is provided between the output terminal 11 and ground voltage source $V_{SS}$.

A parasitic capacitor 31 having a capacitance corresponding to the channel width of the MOSFET 17 is provided between the ground voltage source $V_{SS}$ and the junction of the series connected resistor 29 and MOSFET 18.

If the channel lengths and channel widths of the four N channel MOSFETs 14, 15, 17, 18 included in the circuit of FIG. 2 are chosen to be equal, then the resistors 24, 25 of the equivalent circuit of FIG. 3A and the resistors 28, 29 of the equivalent circuit of FIG. 3B have an equal resistance, and the parasitic capacitors 27, 31 also have the same capacitance. Further, the load capacity 26 of FIG. 3A and the load capacitor 30 of FIG. 3B obviously have an equal capacitance, because FIGS. 3A and 3B represent the same circuit. Now let it be assumed that a signal IN2 supplied to the input terminal 22 of the equivalent circuit of FIG. 3A is set at a low level. Then the P channel MOSFET 13 is rendered conducting, and the two N channel MOSFETs 15, 17 are rendered nonconducting. At this time, the load capacitor 26 connected to the output terminal 11 through the MOSFET 13 rendered conducting is charged to a high level. Further, the parasitic capacitor 27 of FIG. 3A is charged to a high level through the series connected MOSFET 13 and resistor 24. Namely, when the output terminal 11 of the equivalent circuit of FIG. 3A is charged to a high level, it is necessary to charge the two capacitors 26, 27.

Now let it be assumed with respect to the equivalent circuit of FIG. 3B that under the above-mentioned condition, a signal IN1 supplied to the input terminal 20 is set at a low level. When said input signal IN1 is set at a low level, the P channel MOSFET 12 is rendered conducting, and the two N channel MOSFETs 14, 18 are rendered nonconducting. At this time, the load capacitor 30 connected to the output terminal 11 through the MOSFET 12 rendered conducting is charged to a high level. Further, a parasitic capacity 31 is charged to a high level through the series connected MOSFET 12 and resistor 29. Namely, when the output terminal 11 of the equivalent circuit of FIG. 3B is charged to a high level, it is necessary to charge the two capacitors 30, 31.

Since the resistors 24, 29 have the same resistance, the parasitic capacitors 27, 31 have the same capacitance, and the load capacitors 26, 30 have the same capacitance, the output terminal 11 of the equivalent circuit of FIG. 3A and that of the equivalent circuit of FIG. 3B can be switched to a high level at the same speed. Since the equivalent circuits of FIGS. 3A and 3B have the same arrangement and the corresponding elements of both equivalent circuits have the same value, the output terminals 11 of both circuits previously charged to a high level can be discharged to a low level at the same speed. When the MOS logic circuit of FIG. 2 is allowed to act as an inverter by operating either input terminal 20 or input terminal 22, the output terminal 11 can always be charged and discharged at the same speed. The equivalent circuits of FIGS. 3A and 3B have the same arrangement, and the corresponding elements of both circuits have the same value. Therefore, said equivalent circuits have an equal threshold voltage. The noise margin in an inverter circuit is generally supposed to correspond to the threshold voltage of said inverter circuit. However, both equivalent circuits of FIGS. 3A and 3B have the same threshold voltage. With the MOS logic circuit of FIG. 2, therefore, it is possible to eliminate differences in the level of the noise margin which result when the input terminal 20 or 22 is used.

With the MOS logic circuit of FIG. 2, according to the first embodiment of this invention, the series circuits 16, 19 are connected between the output terminal 11 and ground voltage source $V_{SS}$. When, therefore, said MOS logic circuit is constructed with the capacitance of the N channel side thereof to drive a load by current (hereinafter referred to as "a load current-driving capacitance") rendered equal to that of the N channel side of the conventional MOS logic circuit of FIG. 1A, it is possible to reduce the load current-driving capacitance of each of the four N channel MOSFETs 14, 15, 17, 18 to half that of each of the two N channel MOSFETs 4, 5 included in the conventional MOS logic circuit of FIG. 1A. If, therefore, the MOSFETs 14, 15, 17, 18 of the MOS logic circuit of FIG. 2 have equal channel lengths, then the channel widths of said MOSFETs 14, 15, 17, 18 can be decreased to half that of the MOSFETs 4, 5 of the conventional MOS logic circuit of FIG. 1A. Consequently, it is possible for the parasitic capacitors 27, 31 of FIGS. 3A, 3B to have much smaller capacitances than those parasitic capacitors which are produced in the corresponding positions of the equivalent circuit of the conventional MOS logic circuit of FIG. 1A. The output terminal 11 of the MOS logic circuit of FIG. 2 according to the first embodiment of the invention can be charged and discharged at a higher speed than in the conventional MOS logic circuit of FIG. 1A.

The MOS logic circuit according to the second embodiment of this invention depicted in FIG. 4A will now be described. As seen from the symbol chart of FIG. 4B, the MOS logic circuit of FIG. 4A according to the second embodiment of the invention is applied to a 3-input CMOS NAND gate. Three P channel MOSFETs 42, 43, 44, each acting as a current passage are connected in parallel between the power source $V_{DD}$ and logic signal output terminal 41. Further connected in parallel between said output terminal 41 and ground voltage source $V_{SS}$ is a series circuit 48 consisting of three N channel MOSFETs 45, 46, 47, each acting as a current passage; a series circuit 52 consisting of three N channel MOSFETs 49, 50, 51, each acting as a current passage; and a series circuit 56 consisting of three N channel MOSFETs 53, 54, 55, each acting as a current passage. The gate electrodes of the MOSFETs 42, 45, 50, 55 are jointly connected through a line 58 to the logic signal input terminal 57 supplied with a logic input signal IN1. The gate electrodes of the MOSFETs 43, 46, 51, 53 are jointly connected through a line 60 to a logic signal input terminal 59 supplied with a logic input signal IN2. The gate electrodes of the MOSFETs 44, 49, 54 are jointly connected through a line 62 to the logic signal input terminal 61 supplied with a logic input signal IN3. The gate electrodes of the respective groups of three MOSFETs in each circuit 48, 52 and 56 are connected each to a different one of input terminals 57, 59, 61. Throughout the three parallel connected series circuits 48, 52, 56, the gate electrodes of the three MOSFETs occupying the same corresponding positions are also connected each to a different one of the input terminals 57, 59, 61. The nine MOSFETs (45, 46, 47), (49, 50, 51) and (53, 54, 55) of FIG. 4A, constitute groups of three for which the series circuits 48, 52, 56, respectively, are chosen to have equal channel lengths and equal channel widths.

Figure 4A:
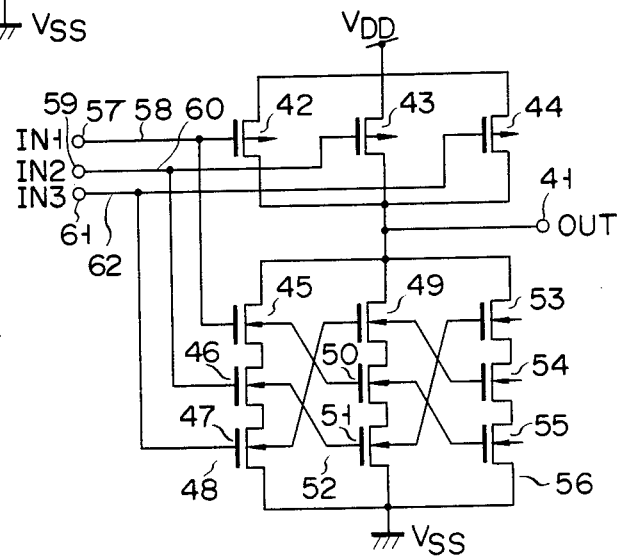
FIG. 4A sets forth the arrangement of a MOS logic circuit according to a second embodiment of the invention.
Figure 4B:
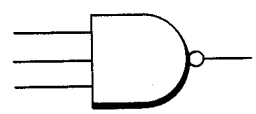
FIG. 4B illustrates a symbol of the MOS logic circuit of FIG. 4A.

When the MOS logic circuit of FIG. 4A, according to the second embodiment of the invention, is used as an ordinary 3-input NAND gate, the three input terminals 57, 59, 61 are respectively supplied with input signals IN1, IN2, IN3. The same number of MOSFETs involved in each of the three series circuits 48, 52, 56 are rendered conducting or nonconducting. As a result, the output terminal 41 sends forth an output signal obtained by converting three output signals IN1, IN2, IN3 into the form of the NAND logic. Namely, the MOS logic circuit of FIG. 4A acts as the ordinary 3-input NAND gate.

Figure 5A:
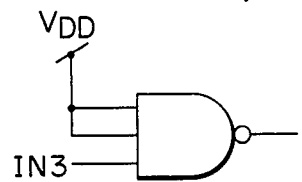
FIG. 5A is a symbol indicating a circuit connection when the MOS logic circuit shown by the symbol of FIG. 4B is applied as an inverter.
Figure 5B:
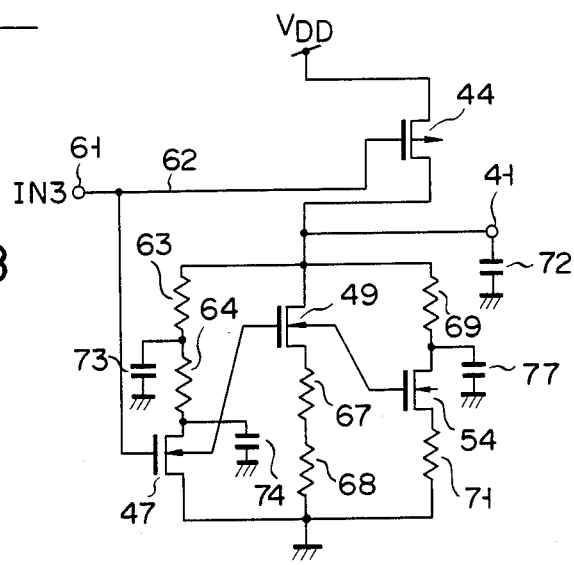
FIG. 5B is an equivalent circuit arrangement corresponding to the symbol of FIG. 5A.

The case where the MOS logic circuit of FIG. 4A acts as an inverter with two of the three input signals IN1, IN2, IN3 fixed at a high level will now be described. When, as seen from the symbol chart of FIG. 5A, the input signals IN1, IN2 are set at a high level, the P channel MOSFETs 42, 43 are rendered nonconducting, and the N channel MOSFETs 45, 50, 55, 46, 51, 53 are rendered conducting. FIG. 5B depicts an equivalent circuit corresponding to the above-mentioned condition. Resistors 63, 64, 67, 68, 69, 71 included in the equivalent circuit of FIG. 5B have a resistance equal to that of the N channel MOSFETs 45, 46, 50, 51, 53, 55 when rendered conducting. The capacitor 72 represents a load capacitance. The capacitors 73, 74, 77 are parasitic capacitors respectively having capacitances corresponding to the channel widths of the MOSFETs 45, 46, 53.

Figure 6A:
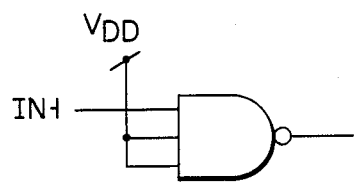
FIG. 6A sets forth a symbol illustrating a circuit arrangement when the MOS logic circuit symbolized in FIG. 4B is used as an inverter.
Figure 6B:
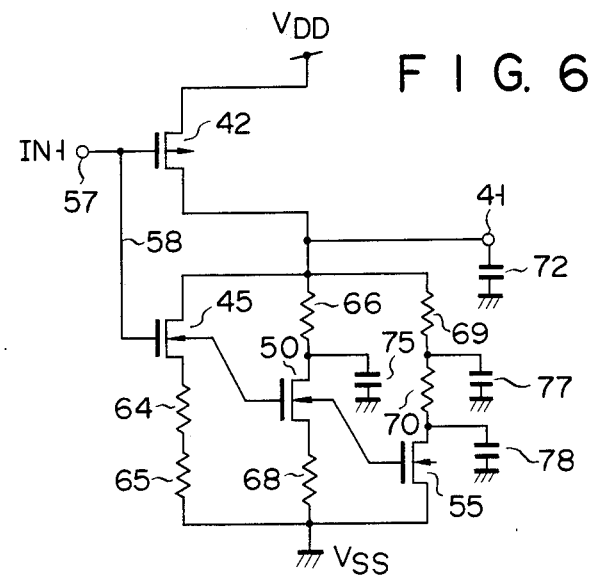
FIG. 6B is an equivalent circuit of the symbol of FIG. 6A.

When, as indicated in the symbol chart of FIG. 6A, the input signals IN2, IN3 are set at a high level, the P channel MOSFETs 43, 44 are rendered nonconducting, and the N channel MOSFETs 46, 52, 53, 47, 49, 54 are rendered conducting. FIG. 6B shows an equivalent circuit corresponding to the above-mentioned case. The resistors 64, 65, 66, 68, 69, 70 included in the equivalent circuit of FIG. 6B have resistances equal to those of the N channel MOSFETs 46, 47, 49, 51, 53, 54 when rendered conducting. The capacitor 72 denotes a load capacitance like that in the equivalent circuit of FIG. 6B. The capacitors 75, 77, 78 represent parasitic capacitances corresponding to the channel width of the MOSFETs 49, 53, 54.

When, as seen from the symbol chart of FIG. 7A, the input signals IN1, IN3 are set at a high level, the P channel MOSFETs 42, 44 are rendered nonconducting and the N channel MOSFETs 45, 50, 55, 47, 49 54 are rendered conducting. FIG. 7B shows an equivalent circuit corresponding to the above-mentioned condition. The resistors 63, 65, 66, 67, 70, 71 included in the equivalent circuit of FIG. 7B have resistances equal to those of the N channel MOSFETs 45, 47, 49, 50, 54, 55 when rendered conducting. The capacitor 72 denotes a load capacitance as in the circuits of FIGS. 5B and 6B. The capacitors 73, 75, 76 represent parasitic capacitances having a capacitance corresponding to the channel widths of the MOSFETs 45, 49, 50. The equivalent circuits of FIGS. 5B, 6B and 7B indicate, as in the previously described case, only those capacitances which are substantially related to the charge and discharge of the output terminal 41.

When the MOS logic circuit of FIG. 4A is allowed to act as an inverter by operating one of the three input terminals 57, 59, 61, the resistors 63 to 71 included in FIGS. 5B, 6B, 7B have an equal resistance. The parasitic capacitors 73 to 78 have an equal capacitance. Further, the load capacitor 72 shown in the equivalent circuits of FIGS. 5B, 6B, 7B has the same capacitance.

When, therefore, the input signals IN3, IN1, IN2 are set at a low level, and the output terminal 41 is charged to a high level, then said output terminal 41 is charged and discharged at the same speed as in the equivalent circuits of FIGS. 5B, 6B, 7B. Similarly, the output terminal 41 previously charged to a high level can be discharged to a low level at the same speed as in said equivalent circuits. Namely, with the MOS logic circuit of FIG. 4A, the output terminal 41 can always be charged or discharged at the same speed, regardless of which of the input terminals 57, 59, 61 is operated.

The equivalent circuits of FIGS. 5B, 6B, 7B which have the same arrangement, and in which the corresponding elements respectively have the same value are impressed with the same threshold voltage. For the same reason as previously given, therefore, it is possible to eliminate that difference in the noise margin which might be caused by the selective operation of the input terminals 57, 59, 61.

The following describes the case where the N channel side of the MOS logic circuit shown in FIG. 4A is given the same load current-driving capacitance as that of the N channel side of the conventional 3-input NAND gate, in which three N channel MOSFETs connected in series between the output terminal 41 and ground voltage source $V_{SS}$ (said 3-input NAND gate is constructed with the same basic concept as the conventional 2-input NAND gate of FIG. 1A). With the MOS logic circuit of FIG. 4A, three series circuits 48, 52, 56 are connected in parallel between the output terminal 41 and ground voltage source $V_{SS}$. Therefore, the nine MOSFETs 45, 46, 47, 49, 50, 51, 53, 54, 55 can have their respective load current-driving capacitances reduced to one-third of what was required in the conventional MOS logic circuit. Assuming, therefore, that the nine MOSFETs have the same channel lengths, their channel widths can be reduced to one-third of what was required in the conventional MOS logic circuit. With the MOS logic circuit of FIG. 4A, according to the second embodiment of this invention, therefore, the output terminal 41 can be charged or discharged at a higher speed than in the case where the conventional MOS logic circuit is allowed to act as an inverter by operating an input terminal, which gives rise to the slowest charging or discharging speed of the output terminal.

FIG. 8, which shows the arrangement of the MOS logic circuit of the invention used as a CMOS NAND gate or CMOS NOR gate having n logic signal input terminals, will now be described. With the ordinary MOS logic circuit having n logic signal input terminals, a plurality of series circuits respectively consisting of n MOSFETs are connected in parallel between a logic signal output terminal OUT and voltage source $V_{DD}$ or $V_{SS}$. The gate electrodes of the n MOSFETs included in each series circuit are connected to n different logic signal input terminals. Further, the gate electrodes of n MOSFETs occupying the same corresponding position throughout said n series circuits are each connected to a different one of the n logic signal input terminals. In FIG. 8, a circle denotes a P or N channel MOSFET. Numerals ranging from 1 to n which are placed in the circles represent the repsective the kind of input terminal to which the gate electrode of each MOSFET is connected. As shown in FIG. 8, the i-th ($1 \leq i \leq n$) MOSFET in each of the n series circuits is connected to a different input terminal.

When used as an inverter with n−1 input signals set at a high or low level, the MOS logic circuit arranged as shown in FIG. 8 enables the dependency of the charging or discharging speed of the output terminal OUT and the threshold voltage of said MOS logic circuit on the selective operation of a plurality of input terminals to be more effectively eliminated than in the MOS logic circuit in which n MOSFETs are connected in series between the output terminal OUT and voltage source $V_{DD}$ or $V_{SS}$.

FIGS. 9A to 13A of a MOS logic circuit according to various embodiments of this invention will now be described. FIGS. 9B to 13B are the symbol charts of said embodiments. The MOS logic circuit of FIG. 9A comprises P channel MOSFETs 101, 102 and N channel MOSFETs 103 to 106. One CMOS inverter 112 consisting of P channel MOSFET 108 and N channel MOSFET 110, and another CMOS inverter 113 consisting of P channel MOSFET 109 and N channel MOSFET 111 are cascade connected to the output terminal of a CMOS NAND gate 107 of FIG. 9A embodying this invention.

The MOS logic circuit of FIG. 9A in which the two CMOS inverters 112, 113 are cascade connected to the output terminal of the CMOS NAND gate 107 assures a higher output terminal-driving capacitance than when the CMOS NAND gate 107 alone is used.

The MOS logic circuit of FIG. 10A is formed from P channel MOSFETs 101, 102 and N channel MOSFETs 103 to 106. A CMOS inverter 120 consisting of a P channel MOSFET 114 and N channel MOSFET 117 is connected to one of the two input terminals of the 2-input CMOS NAND gate 107 of the invention. A CMOS inverter 121 consisting of a P channel MOSFET 115 and N channel MOSFET 118 is connected to the other of the two input terminals of said 2-input CMOS NAND gate 107. A CMOS inverter 122, consisting of a P channel MOSFET 116 and N channel MOSFET 119, is connected to the output terminal of said 2-input CMOS NAND gate 107.

With the MOS logic circuit of FIG. 10A, in which two input signals supplied to the CMOS NAND gate 107 are respectively received by the inverters 120, 121, it is possible to eliminate the dependency of a noise margin in the CMOS NAND gate 107 on the selective application of the plural input terminals. Further, the dependency of the charging or discharging speed of the output terminal on the selective operation of the plural input terminals is removed by application of four N channel MOSFETs 103 to 106.

Figure 11A:
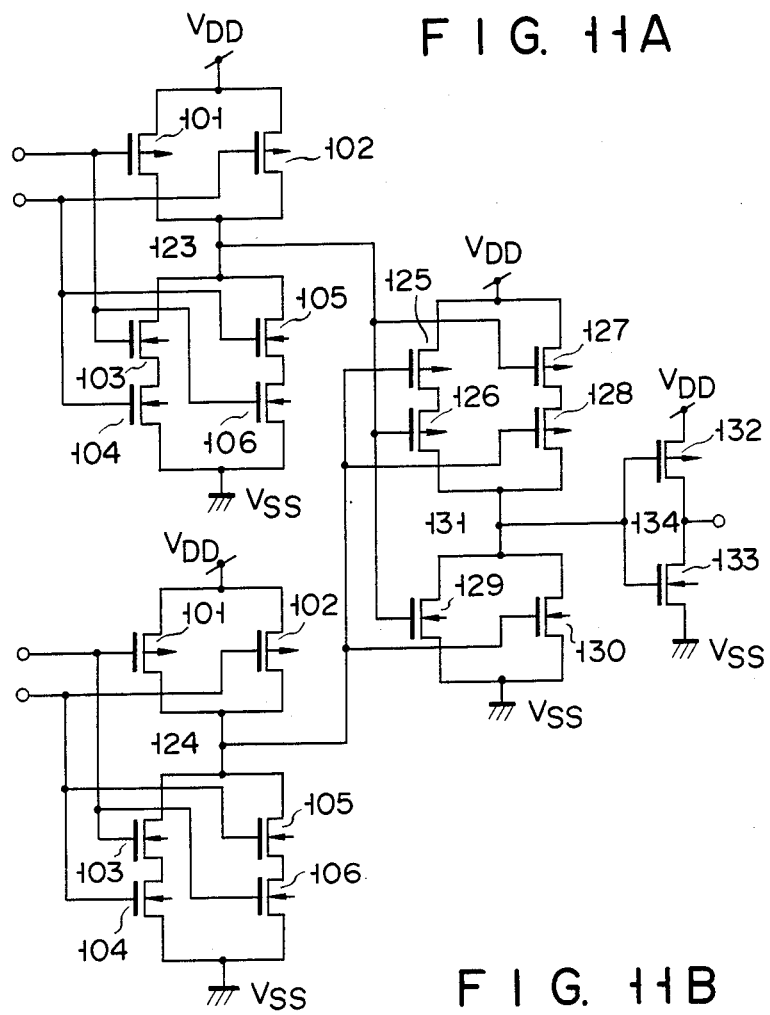

A description follows of the embodiment of FIG. 11A, which consists of a combination of:

two 2-input CMOS NAND gates 123, 124, each of which comprises two P channel MOSFETs 101, 102 and four N channel MOSFETs 103 to 106;

a 2-input CMOS NOR gate 131 comprising P channel MOSFETs 125 to 128 and N channel MOSFETs 129, 130; and a CMOS inverter comprising a P channel MOSFET 132 and N channel MOSFET 133.

Figure 11B:
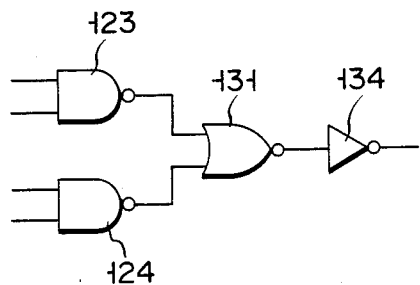

As seen from the symbol chart of FIG. 11B, the whole of the embodiment of FIG. 11A constitutes a 4-input CMOS NAND circuit.

Figure 12A:
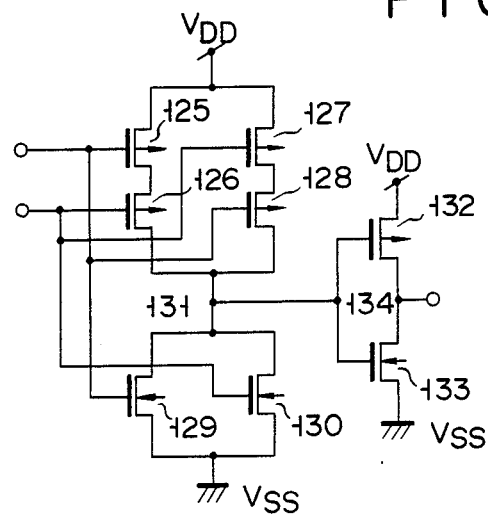
Figure 12B:
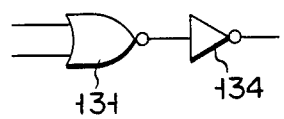

FIG. 12A of a MOS logic circuit according to another embodiment of the invention will now be described. This embodiment comprises four P channel MOSFETs 125 to 128 and two N channel MOSFETs 129, 130. The output terminal of a 2-input CMOS NOR gate 131 embodying the invention is connected to a CMOS inverter 134 consisting of a P channel MOSFET 132 and N channel MOSFET 133. The whole of the embodiment of FIG. 12A constitutes a 2-input CMOS or circuit as shown in the symbol chart of FIG. 12B.

Figure 13A:
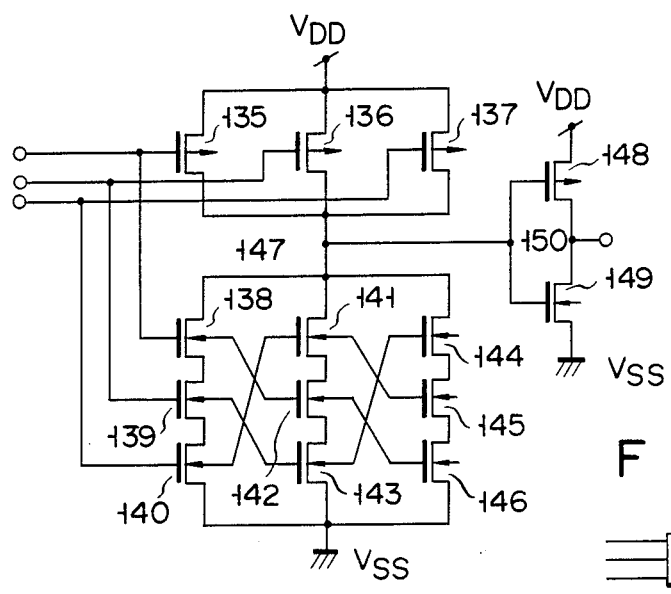
Figure 13B:
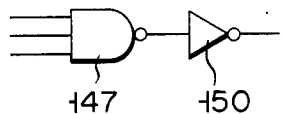

FIG. 13A of a MOS logic circuit according to another embodiment of the invention will now be described. This embodiment comprises P channel MOSFETs 135 to 137 and N channel MOSFETs 138 to 146. The output terminal of a 3-input CMOS NAND gate 147 embodying the invention is connected to a CMOS inverter 150 consisting of a P channel MOSFET 148 and N channel MOSFET 149. The whole of the embodiment of FIG. 13A constitutes a 3-input CMOS AND circuit as shown in the symbol chart of FIG. 13B.

When the MOS logic circuit of FIG. 1A is integrated, a number of MOSFETs having small channel widths are put together. The reason is that if a large MOSFET is formed by the silicon gate process, a line made of a conductive layer partly acting as a gate electrode will be lengthened and the resultant increased resistance of said line will exert an effect which can not be overlooked. When, therefore, a circuit section of the conventional MOS logic circuit of FIG. 1a involving two series connected N channel MOSFETs 4, 5 is integrated, the resultant integrated circuit generally shows a pattern of the type illustrated in FIG. 14. Namely, connected in parallel between the output terminal 1 and ground voltage source $V_{SS}$ are four series circuits, 8A to 8D, each consisting of the corresponding parts of four N channel MOSFETs, 4A to 4D each having a channel width equal to one-fourth of that of the MOSFET 4 of the conventional MOS logic circuit of FIG. 1A and the corresponding parts of four N channel MOSFETs, 5A to 5D, each having a channel width equal to one-fourth of that of the MOSFET 5 of said conventional MOS logic circuit. The gate electrodes of the MOSFETs 4A to 4D are jointly connected to an input terminal 6 supplied with an input signal IN1. The gate electrodes of the MOSFETs 5A to 5D are jointly connected to an input terminal 7 supplied with an input signal IN2. Namely, the two MOSFETs 4, 5 included in the conventional MOS logic circuit of FIG. 1A are respectively divided into a group of four MOSFETs 4A to 4D and a group of four MOSFETs 5A to 5D in the integrated MOS logic circuit of FIG. 14. All said MOSFETs 4A to 4D and 5A to 5D have a smaller channel width than the above-mentioned MOSFETs 4, 5.

Figure 14:
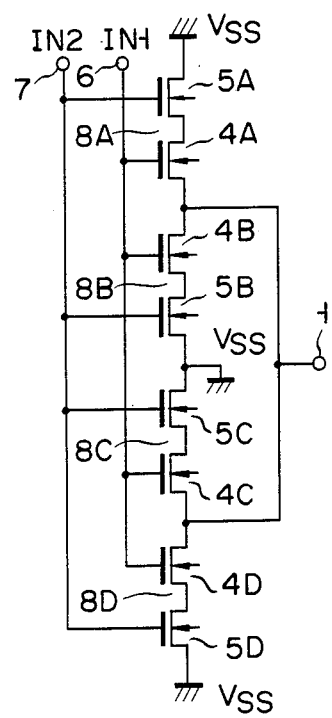
FIG. 14 is a circuit arrangement of the ordinary construction of part of the N channel side when the circuit of FIG. 1A is integrated.
Figure 15:
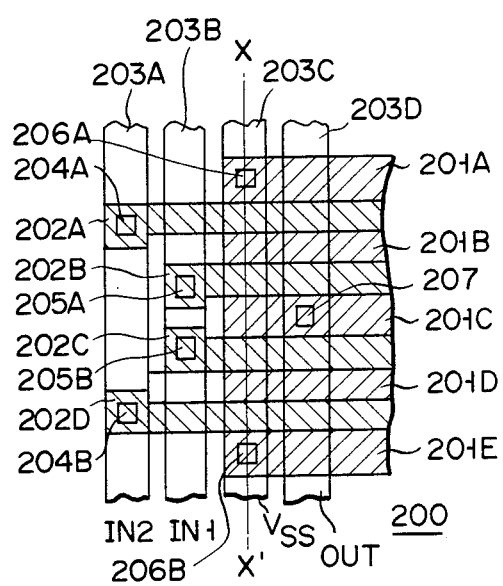
FIG. 15 is a plan view of a fractional pattern of the circuit of FIG. 14.

FIG. 15 is a pattern plan view of part of the integrated MOS logic circuit of FIG. 14. A numeral 200 used in FIG. 15 denotes a P-type semiconductor substrate. A plurality of $N^+$-type regions 210A to 201E are spatially arranged in series on the surface of said P-type semiconductor substrate 200. The uppermost $N^+$-type region 201A constitutes the source region of the MOSFET 5A included in the integrated circuit of FIG. 14. The $N^+$-type region 201B immediately below said uppermost region 201A constitutes a region concurrently acting as the drain region of the MOSFET 5A and the source region of the MOSFET 4A. The $N^+$-type region 201C immediately below said $N^+$-type region 201B constitutes a region concurrently acting as the drain region of the MOSFET 4A and the drain region of the MOSFET 4B. The $N^+$-type region 201D immediately below said $N^+$-type region 201C constitutes a region concurrently acting as the source region of the MOSFE 4B and the drain region of the MOSFET 5B. The lowermost $N^+$-type region 201E immediately below said N+-type region 201D constitutes a region concurrently acting as the source region of the MOSFET 5B and the source region of the MOSFET 5C. A polycrystal silicon gate electrode layer 202A of the MOSFET 5A is mounted on the surface of an intervening region between the aforesaid two N+-type 201A and 201B with a gate insulation layer (not shown) interposed between said layer and surface. Likewise, the polycrystal silicon gate electrode layers 202B, 202C, 202D are respectively mounted on the surfaces of intervening regions between the two N+-type regions 201B and 201C, between the two N+-type regions 201C and 201D, and between the two N+-type regions 201D and 201E with a gate insulation layer (not shown) provided in the respective intervening regions. Four aluminum layers 203A to 203D extending in the same direction as the aforesaid N+-type regions 201A to 201E are arranged are mounted in parallel on the corresponding gate electrode layers 202A to 202D with an insulation layer (not shown) provided between the respective intervening regions. An input signal IN2 supplied to the input terminal 7 of FIG. 1A is transmitted through one (203A) of the above-mentioned four aluminum layers. This aluminum layer 203A is connected to the gate electrode layers 202A, 202 through the corresponding contact holes 204A, 204B. An input signal IN1 supplied to the input terminal 6 of FIG. 1A is transmitted through the aluminum layer 203B. This aluminum layer 203B is connected to the gate electrode layers 202B, 202C through the corresponding contact holes 205A, 205B. Another aluminum layer 203C which is impressed with the ground voltage $V_{SS}$ is connected to the N+-type regions 201A, 201E through the corresponding contact holes 206A, 206B. The output signal OUT (FIG. 1A) is sent out through the remaining aluminum layer 203D, which is connected to the N+-type region 201C through a contact hole 207.

Figure 16:
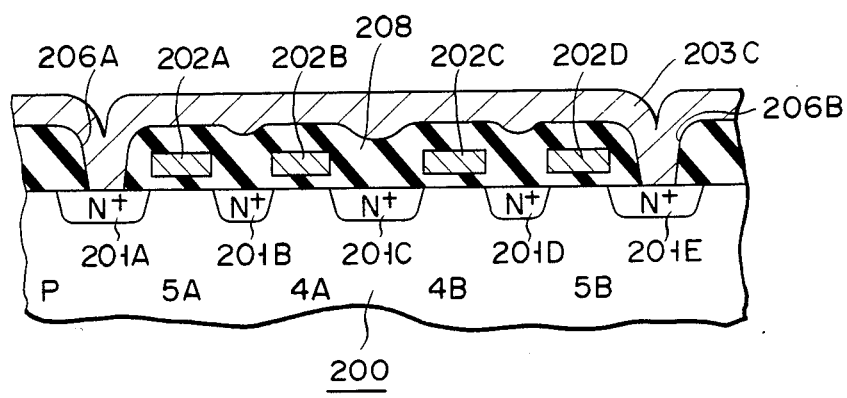
FIG. 16 is an enlarged cross sectional view on line X-X' of the plan view of FIG. 15.

FIG. 16 is an enlarged sectional view on line X-X' from the plan view of FIG. 15. The sectional view of FIG. 16 indicates four MOSFETs 5A, 4A, 4B, 5B included in the MOS logic circuit of FIG. 14. A numeral 208 shown in FIG. 16 denotes an insulation layer involving the aforementioned gate insulation layer. The two gate electrode layers 202B and 202C facing each other on both sides of the central N+-type region 201C are connected to the aluminum layers 203B through which the input signal IN1 of FIG. 1A is transmitted. Likewise, the two gate electrode layers 202A, 202D facing each other on both sides of the central N+-type region 201C are connected to the aluminum layer 203A.

Figure 17:
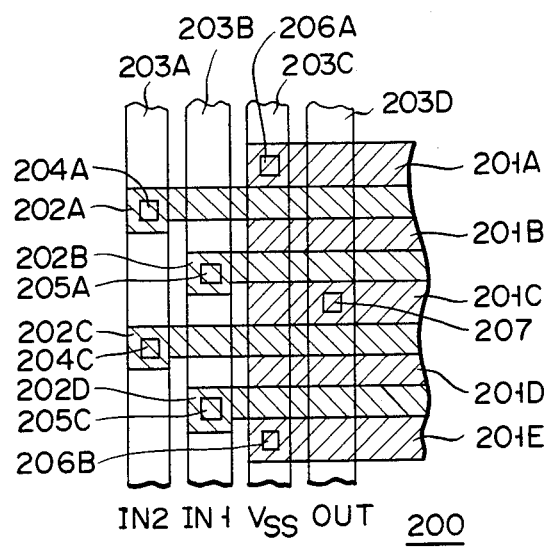
FIG. 17 is a pattern plan view corresponding to the integration of the circuit of FIG. 2.

When the MOS logic circuit of FIG. 2 embodying this invention arranged as described above is integrated, the gate electrodes of the MOSFETs 4A, 4C, respectively, included in the series circuits 8A, 8C are supplied with an input signal IN1. The gate electrodes of the MOSFETs 5A, 5C, respectively, included in said series circuits 8A, 8C, are supplied with an input signal IN2. The gate electrodes of the MOSFETs 4B, 4C, respectively, included in the two series circuits 8B, 8D are supplied with an input signal IN2. The gate electrodes of the MOSFETs 5B, 5D, respectively, included in the two series circuits 8B, 8D are supplied with an input signal IN1. The above-mentioned arrangement assures the integration of the MOS logic circuit of FIG. 2 embodying this invention. FIG. 17 is a pattern plan view corresponding to FIG. 15 when said MOS logic circuit of FIG. 2 is integrated.

The pattern plan view of FIG. 17 is different from that of FIG. 15 in that the gate electrode layer 202C is not connected to the aluminum layer 203B, but to the aluminum layer 203A through the contact hole 204C. The gate electrode layer 202D is not connected to the aluminum layer 203A, but to the aluminum layer 203B through the contact hole 205C. The gate electrodes of the MOSFETs 4D, 5D included in the circuit of FIG. 14 are connected in a different way from FIG. 15. Namely, in the pattern plan view of FIG. 17, the two gate electrode layers 202B, 202C facing each other on both sides of the central N+-type region 201C connected to the aluminum layer 203D are respectively connected to the aluminum layers 203B, 203A. The two gate electrode layers 202A, 202D facing each other on both sides of the central N+-type regions 201C are connected to the aluminum layers 203A, 203B, respectively. The MOS logic circuit of FIG. 2 embodying this invention can be constructed simply by slightly changing the connection of layers from the conventional pattern of FIG. 15, thereby substantially eliminating any increase in a chip area.

Figure 18:
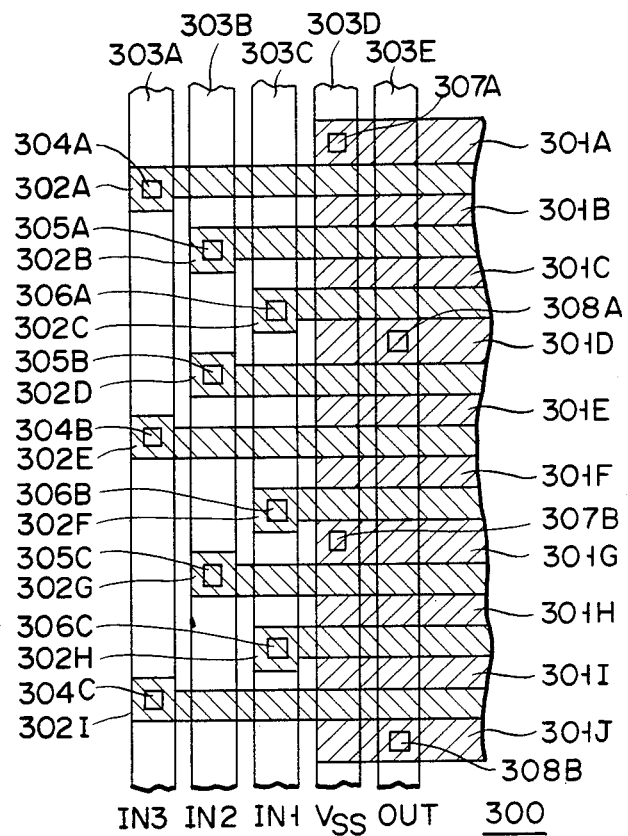
FIG. 18 is a pattern plan view corresponding to the integration of the circuit of FIG. 4A.

FIG. 18 is a pattern plan view of part of the N channel side of the 3-input CMOS NAND gate of FIG. 4A when it is integrated. In the MOS logic circuit of FIG. 4A, each of the N channel MOSFETs, together constituting three groups (45-46-47), (49-50-51), (53,-54,-55), consists of four minor MOSFETs having smaller channel widths like the MOS logic circuit of FIG. 14. However, the pattern plan view of FIG. 18 indicates one MOSFET belonging to each of said three groups, which occupies the corresponding position. A numeral 300 indicated in FIG. 18 represents a P-type semiconductor substrate. A plurality of N+-type regions 301A, 301B, ... 301J are spatially arranged in a series on the surface of said P-type semiconductor substrate. Like the plural N+-type regions 201C included in the MOS logic circuit of FIG. 17, the N+-type regions 301A, 301B, ... 301J partly act as source or drain regions for N channel MOSFETs or concurrently act as both source and drain regions thereof. A plurality of polycrystal silicon gate electrode layers 302A, 302B, ..., 302I are respectively mounted through a gate insulation layer (not shown) on the surface of a region formed between every adjacent N+regions (for example, between the N+regions 301A and 301B or between 301B and 301C, ... or between 301I and 301J). Further, five aluminum layers 303A to 303E extending in parallel to each other and perpendicular to the aforesaid N+regions 301A, 301B, ..., 301J are arranged as mounted through an insulation layer on the gate electrode layers 302A, 302B, ..., 302I, Input signals IN3, IN2, IN1 supplied to the input terminals 61, 59, 57 are conducted through the three aluminum layers 303A, 303B, 303C included in the above-mentioned five aluminum layers 303A to 303E. One aluminium layer 303A is connected to the gate electrode layers 302A, 302E, 302I through the corresponding contact holes 304A, 304B, 304C. The aluminium layer 303B is connected to the gate electrode layers 302B, 302D, 302G through the corresponding contact holes 305A, 305B, 305C. The aluminium layer 303C is connected to the gate electrode layers 302C, 302F, 302H through the corresponding contact holes 306A, 306B, 306C. The aluminium layer 303D supplied with the voltage of the ground voltage source $V_{SS}$ is connected to the N+regions 301A, 301G through the corresponding contact holes 307A, 307B. The aluminium layer 303E through which the output signal OUT is sent forth is connected to the N+regions 301D, 301J through the corresponding contact holes 308A, 308B. In the 3-input CMOS NAND gate, two gate electrode layers 302C, 302D, facing each other on both sides of the central N+-type region 301D connected to the aluminium layer 303E, are respectively connected to the aluminium layers 303C, 303B. The two gate electrode layers 302B, 302E facing each other on both sides of the central N+-type region 301D are respectively connected to the aluminium layers 303B, 303A. The two gate electrode layers 302A, 302F facing each other and both sides of the central N+-type region 301D are respectively connected to the aluminium layers 303A, 303C.

The description below concerns FIG. 19 which shows a pattern plan view of part of the N channel or P channel side of the n-input CMOS NAND gate or CMOS NOR gate indicated in FIG. 8 when said gate is integrated. When a circuit indicated by the pattern plan view of FIG. 19 represents a NAND gate, then a numeral 400 denotes a P type semiconductor substrate. A numeral 401 denotes an N+region acting as the source and drain regions of the respective N channel MOSFETs. A numeral 402 indicates the gate electrode layer of each MOSFET prepared from polycrystalline silicon. A numeral 403 represents an aluminium layer through which n input signals IN1 to INn are transmitted, or which is impressed with the ground voltage $V_{SS}$ or from which an output signal OUT is issued. A numeral 404 denotes a contact hole which effects a selective connection between the gate electrode layer 402 and aluminium layer 403, or between the N+region 401 and said aluminium layer 403. Provided on both sides of a particular N+region 401, connected to the aluminium layer 403 from which an output signal OUT is sent forth, are two other N+regions impressed with the ground voltage $V_{SS}$. A total of n gate electrode layers 402 are connected in the corresponding positions between still another N+region 401, connected to the aluminium layer 403 from which the output signal OUT is issued, and each of the aforesaid two N+regions set on both sides of the first mentioned N+region 401. Said n gate electrode layers 402 are connected to n different aluminium layers 403 through which n different input signals IN1 to INn flow.

When a 3-input type or n input type circuit is constructed in accordance with the pattern plan view of FIG. 18 or 19, it is possible to provide a MOS logic circuit of FIG. 4A or FIG. 8 embodying this invention simply by changing slightly the wire arrangement of the conventional MOS logic circuit, and moreover importantly without any increase in a chip area.

What is claimed is:

1. A MOS logic circuit comprising:
    a semiconductor substrate of a first conductivity type;
    first to tenth semiconductor regions of a second conductivity type, arranged on said substrate aligned parallel to one another with a specific interval therebetween;
    first to ninth gate layers, respectively formed between said first and second semiconductor regions, said second and third semiconductor regions, said third and fourth semiconductor regions, said fourth and fifth semiconductor regions, said fifth and sixth semiconductor regions, said sixth and seventh semiconductor regions, said seventh and eighth semiconductor regions, said eighth and ninth semiconductor regions, and said ninth and tenth semiconductor regions;
    a first conductive layer, connected to said first and seventh semiconductor regions, for supplying a power source voltage to said first and seventh semiconductor regions;
    a second conductive layers, connected to said fourth and tenth semiconductor regions, for outputting logic output signals from said fourth and tenth semiconductor regions;
    a third conductive layer, connected to said third, sixth and eighth gate layers, for supplying a first logic input signal to said third, sixth and eighth gate layers;
    a fourth conductive layer, connected to said second, fourth, and seventh gate layers, for supplying a second logic input signal to said second, fourth and seventh gate layers; and
    a fifth conductive layer, connected to said first, fifth and ninth gate layers, for supplying a third logic input signal to said first, fifth and ninth gate layers.

2. A MOS logic circuit of claim 1 wherein said first to fifth conductive layers are aligned parallel to one another.

3. A MOS logic circuit of claim 2 wherein said first to fifth conductive layers are aligned perpendicular to said first to ninth gate layers.

* * * * *